US010297705B2

(12) United States Patent
Nada et al.

(10) Patent No.: US 10,297,705 B2
(45) Date of Patent: May 21, 2019

(54) AVALANCHE PHOTODIODE (71) Applicant: NIPPON TELEGRAPH AND TELEPHONE CORPORATION, Tokyo (JP)

(72) Inventors: Masahiro Nada, Tokyo (JP); Yoshifumi Muramoto, Tokyo (JP); Fumito Nakajima, Tokyo (JP); Hideaki Matsuzaki, Tokyo (JP)

(73) Assignee: NIPPON TELEGRAPH AND TELEPHONE CORPORATION, Chiyoda-Ku, Tokyo (JP)

( * ) Notice: Subject to any disclaimer, the term of this patent is extended or adjusted under 35 U.S.C. 154(b) by 40 days.

(21) Appl. No.: 15/532,469

(22) PCT Filed: Nov. 27, 2015

(86) PCT No.: PCT/JP2015/083358
§ 371 (c)(1),
(2) Date: Jun. 1, 2017

(87) PCT Pub. No.: WO2016/088668
PCT Pub. Date: Jun. 9, 2016

(65) Prior Publication Data
US 2018/0331246 A1    Nov. 15, 2018

(30) Foreign Application Priority Data
Dec. 5, 2014 (JP) .................. 2014-246574

(51) Int. Cl.
*H01L 31/107* (2006.01)
*H01L 31/0352* (2006.01)
(Continued)

(52) U.S. Cl.
CPC .. *H01L 31/1075* (2013.01); *H01L 31/022416* (2013.01); *H01L 31/03046* (2013.01); *H01L 31/035281* (2013.01); *Y02E 10/50* (2013.01)

(58) Field of Classification Search
CPC .................................................. H01L 31/1075
(Continued)

(56) References Cited

U.S. PATENT DOCUMENTS 8,575,650 B2* 11/2013 Ishibashi ............. H01L 31/1075
                                                                257/186
2010/0133637 A1* 6/2010 Yagyu ................. H01L 31/1075
                                                                257/438

(Continued)

FOREIGN PATENT DOCUMENTS

CN    1914741 A    2/2007
EP    2378567 A1   10/2011
(Continued)

OTHER PUBLICATIONS

Office Action received for Chinese Patent Application No. 201580066179.3, dated Mar. 19, 2018, 14 pages (6 pages of English Translation and 8 pages of Office Action).
(Continued)

*Primary Examiner* — Jami Valentine Miller
(74) *Attorney, Agent, or Firm* — Womble Bond Dickinson (US) LLP (57) ABSTRACT To obtain high linearity without sacrificing light-receiving sensitivity and a high speed, an avalanche photodiode includes an avalanche layer (103) formed on a first light absorption layer (102), an n-field control layer (104) formed on the avalanche layer (103), and a second light absorption layer (105) formed on the field control layer (104). If a reverse bias voltage is applied, a donor impurity in the field control layer (104) ionizes, and a high electric field is
(Continued)

induced in the avalanche layer (103). The n-type doping amount in the field control layer (104) is set such that the impurity concentration in the second light absorption layer (105) sufficiently depletes at the time of reverse bias application.

6 Claims, 6 Drawing Sheets

(51) Int. Cl.
*H01L 31/0224* (2006.01)
*H01L 31/0304* (2006.01)

(58) Field of Classification Search
USPC .......................................................... 257/438
See application file for complete search history.

(56) References Cited

U.S. PATENT DOCUMENTS

| | | | | |
|---|---|---|---|---|
| 2012/0156826 | A1* | 6/2012 | Sim | H01L 31/107 438/91 |
| 2012/0299141 | A1* | 11/2012 | Sasahata | H01L 31/107 257/434 |

FOREIGN PATENT DOCUMENTS

| | | |
|---|---|---|
| JP | 01-187882 A | 7/1989 |
| JP | H02-119271 A | 5/1990 |
| JP | H06-244450 A | 9/1994 |
| JP | 2000-022197 A | 1/2000 |
| JP | 2004-031707 A | 1/2004 |
| JP | 2012-243907 A | 12/2012 |
| JP | 2013-122989 A | 6/2013 |
| JP | 2013-236012 A | 11/2013 |
| JP | 2016-032034 A | 3/2016 |

OTHER PUBLICATIONS

Office Action received for Japanese Patent Application No. 2016-562419, dated Feb. 5, 2018, 11 pages (5 pages of English Translation and 6 pages of Office Action).

International Search Report and Written Opinion received for PCT Patent Application No. PCT/JP2015/083358, dated Feb. 16, 2016, 14 pages (7 pages of English Translation and 7 pages of Original Document).

International Preliminary Report on Patentability received for PCT Patent Application No. PCT/JP2015/083358, dated Jun. 15, 2017, 12 pages (7 pages of English Translation and 5 pages of Original Document).

Supplementary European Search Report and Written Opinion received for EP Patent Application No. 15864741.2, dated Jun. 25, 2018, 10 pages.

J.C. Campbell, "Recent Advances in Telecommunications Avalanche Photodiodes", Journal of Lightwave Technology, vol. 25, No. 1, pp. 109-121, 2007.

T. Ishibashi et al., "Uni-Traveling-Carrier Photodiodes", Ultrafast Electronics and Optoelectronics, vol. 13, pp. 83-87, 1997.

M. Nada et al., "Inverted InAlAs/InGaAs Avalanche Photodiode with Low.High.Low Electric Field Profile", Japanese Journal of Applied Physics, vol. 51, 02BG03, 2012.

Office Action received for Chinese Patent Application No. 201580066179.3, dated Nov. 15, 2018, 14 pages (7 pages of English Translation and 7 pages of Office Action).

\* cited by examiner

Band diagram of a UTC-PD

FIG. 12

Schematic cross section of proposed p-down inverted APD structure.

AVALANCHE PHOTODIODE

TECHNICAL FIELD

The present invention relates to an avalanche photodiode used as a light-receiving element in optical communication or the like.

BACKGROUND ART

A general optical receiver in optical communication is formed from a light-receiving element such as a photodiode or an avalanche photodiode, and a transimpedance amplifier configured to amplify a photocurrent generated by the light-receiving element. The light-receiving element has a function of converting incident light into a current. In the light-receiving element, a light absorption layer absorbs light, thereby generating pairs of electrons and holes as carriers. When the generated electrons and holes move, a current flows.

The upper limit of the photoelectric conversion efficiency of a photodiode is 100% as quantum efficiency. On the other hand, the avalanche photodiode is a light-receiving element having a function of making photoelectrons generated in the element hit a lattice by accelerating them under a high electric field and thus ionizing the photoelectrons, thereby amplifying the carriers. For this reason, the avalanche photodiode can output a plurality of carriers in correspondence with one photon and obtain a sensitivity higher than 100% as the quantum conversion efficiency. The avalanche photodiode is applied to a high-sensitivity optical receiver (see non-patent literature 1).

In the avalanche photodiode, however, the linearity between the input light intensity and the output electrical signal is poorer than in the photodiode. For this reason, if an optical receiver needs high linearity between the input light intensity and the output electrical signal because of a constraint on the distortion of an output waveform, like a digital coherent method recently under research and development, it is difficult to apply the avalanche photodiode.

This is because holes having a moving velocity lower than that of electrons are accumulated in the light absorption layer if the input light intensity is high. This phenomenon is called a space-charge effect. In the photodiode, the accumulated holes locally lower the field strength in an absorption layer. However, the linearity of the response is ensured until the field strength becomes almost 0. On the other hand, in the avalanche photodiode, since charges by the accumulated holes lower the field strength in an avalanche layer, the multiplication factor lowers in a case in which the input light intensity is high. For this reason, in the avalanche photodiode, the linearity of the electrical output strength with respect to the input light intensity is poorer than in the photodiode.

As a general means for solving the above-described problem of the avalanche photodiode, it is considered that a light absorption layer having a uni-traveling carrier photodiode (UTC-PD) structure is formed. In the UTC-PD structure, the light absorption layer is formed into p-type by doping. Hence, the linearity of the electrical output strength with respect to the input light intensity does not degrade in accordance with hole accumulation caused by a high input light intensity (see non-patent literature 2).

More specifically, a photodiode normally has a p-i-n photodiode (pin-PD) structure in which an undoped layer (i-layer) serving as a light absorption layer is sandwiched between a layer (p-layer) formed into p-type by doping and a layer (n-layer) formed into n-type by doping. In the pin-PD structure, carriers generated in the light absorption layer are accelerated by the electric field in the depleted undoped layer so that the carriers can move at a high speed. However, of the generated carriers, holes have a moving velocity lower than that of electrons. This is a factor to limit the operation speed.

Figure 11:
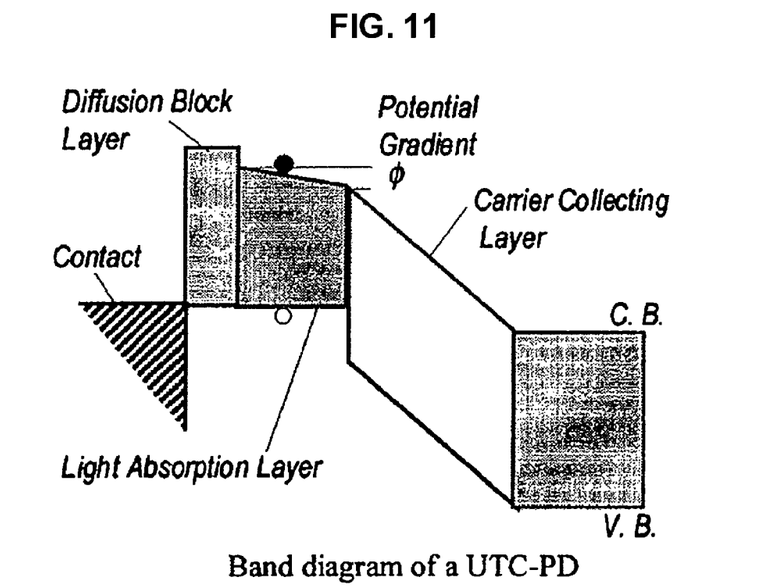
FIG. 11 is a band diagram for explaining a UTC-PD structure.

An element having the UTC-PD structure eliminates the factor that limits the speed in the above-described pin-PD structure, thereby further speeding up the operation. In an undoped structure, the light absorption layer is undoped, and no carrier collecting layer is included. In the UTC-PD structure, however, the light absorption layer is of p-type, and a region (depletion layer) to be depleted at the time of an operation is formed as a carrier collecting layer made of a material different from the material of the light absorption layer, as shown in FIG. 11 (see non-patent literature 2). With this structure, minority carriers (electrons) generated in the light absorption layer can be diffused to the depleted carrier collecting layer. In addition, to prevent the electrons from diffusing back to the p-contact side, a p-type "diffusion block layer" is inserted between the p-contact and the light absorption layer.

Of the carriers generated in the p-type light absorption layer, the holes need a time corresponding to the dielectric relaxation time (on the $10^{-12}$ sec order) for response. Hence, the holes are not accumulated. That is, as the factor to decide the speed of the element, only the movement of electrons needs to be taken into consideration. The movement of electrons in the UTC-PD includes diffusion in the p-absorption layer and drift in the carrier collecting layer. When an overshoot effect is used in the carrier collecting layer, the drift time shortens, and an ultrahigh-speed operation at 100 GHz or more can be obtained.

However, the carrier transit time in a general undoped light absorption layer is inversely proportional to the absorption layer thickness, and the carrier transit time in the light absorption layer of the UTC-PD structure is inversely proportional to the square of the absorption layer thickness. That is, in the UTC-PD structure, if the absorption layer is made thin while making a great sacrifice of sensitivity, an ultrahigh-speed operation at 100 GHz or more can be obtained. However, in a band of several ten GHz, a higher sensitivity is obtained by an undoped light absorption layer in some cases. In the UTC-PD structure, the upper limit of the photoelectric conversion efficiency is 100% as quantum efficiency. Additionally, especially when the absorption layer is made thick to raise the sensitivity, the sensitivity largely degrades.

Figure 12:
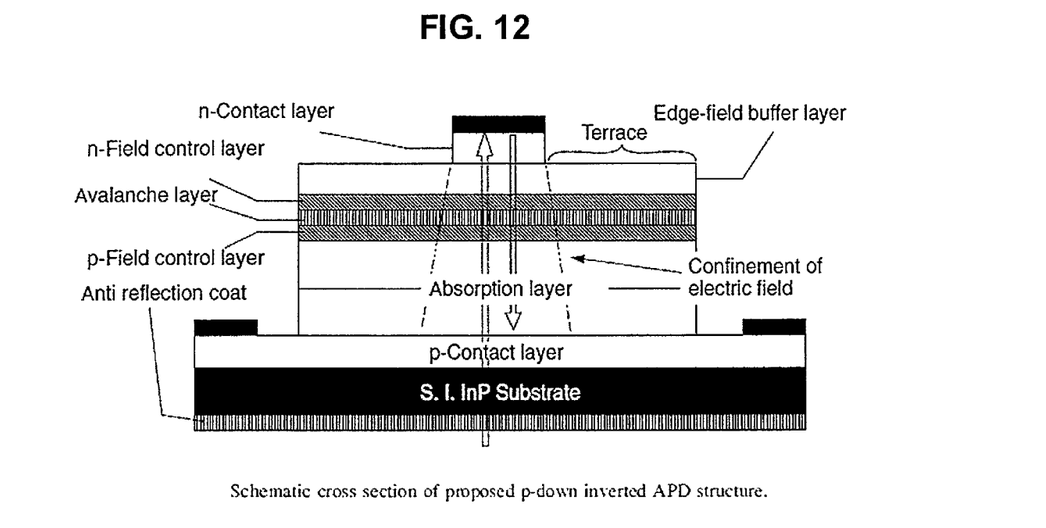
FIG. 12 is a view for explaining an avalanche photodiode using an undoped absorption layer.

Note that in an avalanche photodiode using an undoped absorption layer, as shown in FIG. 12, an undoped light absorption layer, a p-field control layer, an InAlAs avalanche layer, an n-field control layer, an InP edge-field buffer layer, and an n-contact layer are provided on a p-type InP contact layer (see non-patent literature 3). In this structure, a sensitivity higher than 100% as the quantum conversion efficiency can be obtained by amplifying the carriers in the avalanche layer. However, the linearity is poor because the undoped absorption layer is used.

RELATED ART LITERATURE

Non-Patent Literature

Non-Patent Literature 1: J. C. Campbell, "Recent Advances in Telecommunications Avalanche Photodiodes", Journal of Lightwave Technology, vol. 25, no. 1, pp. 109-121, 2007.

Non-Patent Literature 2: T. Ishibashi, N. Shimizu, S. Kodama, H. Ito, T. Nagatsuma and T. Furuta, "Uni-Traveling-Carrier Photodiodes", Ultrafast Electronics and Optoelectronics, vol. 13, pp. 83-87, 1997.

Non-Patent Literature 3: M. Nada, Y. Muramoto, H. Yokoyama, N. Shigekawa, T. Ishibashi, and S. Kodama, "Inverted InAlAs/InGaAs Avalanche Photodiode with Low.High.Low Electric Field Profile", Japanese Journal of Applied Physics, vol. 51, 02BG03, 2012.

DISCLOSURE OF INVENTION

Problem to be Solved by the Invention

In both the light absorption layer of the UTC-PD structure and that of the undoped structure, the sensitivity is dominated by the absorbance in the light absorption layer, and the speed is dominated by the carrier transit time. For this reason, to raise the sensitivity, the absorption layer is required to be thick. To increase the speed, the absorption layer is required to be thin. A trade-off relationship substantially holds between a high-speed operation and a high-sensitivity operation. In particular, if improvement of linearity is taken into consideration, a light absorption layer having the UTC-PD structure is preferably selected. However, sensitivity degradation more than in a normal undoped light absorption layer occurs, as described above. As described above, conventionally, it is impossible to obtain high linearity without sacrificing the light-receiving sensitivity and high speed.

The present invention has been made to solve the above-described problem, and has as its object to obtain high linearity in an avalanche photodiode without sacrificing light-receiving sensitivity and high speed.

Means of Solution to the Problem

According to the present invention, there is provided an avalanche photodiode comprising a p-contact layer made of a p-type semiconductor, a first light absorption layer formed on the p-contact layer and made of a p-type semiconductor, an avalanche layer formed on the first light absorption layer, a field control layer formed on the avalanche layer, a second light absorption layer formed on the field control layer, an n-contact layer formed on the second light absorption layer and made of an n-type semiconductor, a p-contact connected to the p-contact layer, and an n-contact connected to the n-contact layer.

In the avalanche photodiode, the first light absorption layer and the avalanche layer are formed into an area larger than that of the n-contact layer.

The avalanche photodiode may further comprise a diffusion barrier layer arranged between the p-contact layer and the first light absorption layer and made of a p-type semiconductor, wherein a conduction band end of the diffusion barrier layer is higher than that of the first light absorption layer.

The avalanche photodiode may further comprise an edge-field buffer layer arranged between the second light absorption layer and the n-contact layer and made of a semiconductor with a band gap energy larger than that of the second light absorption layer.

The avalanche photodiode may further comprise a p-semiconductor layer arranged between the avalanche layer and the first light absorption layer and made of a p-type semiconductor with a band gap energy larger than that of the avalanche layer.

Effect of the Invention

As described above, according to the present invention, the first light absorption layer and the second light absorption layer, both of which are of p-type, are provided to sandwich the avalanche layer. It is therefore possible to obtain a great effect of implementing high linearity in an avalanche photodiode without sacrificing light-receiving sensitivity and high speed.

BEST MODE FOR CARRYING OUT THE INVENTION

The embodiments of the present invention will now be described with reference to the accompanying drawings.

First Embodiment

Figure 1:
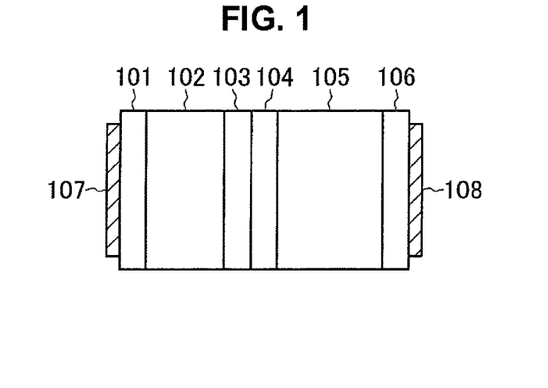
FIG. 1 is a sectional view showing the structure of an avalanche photodiode according to the first embodiment of the present invention.

The first embodiment of the present invention will be described first with reference to FIG. 1. FIG. 1 is a sectional view showing the structure of an avalanche photodiode according to the first embodiment of the present invention. This avalanche photodiode includes a p-contact layer 101 made of a p-type semiconductor, a first light absorption layer 102 formed on the p-contact layer 101 and made of a p-type semiconductor, and an avalanche layer 103 formed on the first light absorption layer 102. The first light absorption layer 102 is formed into p-type by introduction (doping) of a p-type impurity. Note that the first light absorption layer 102 is not so much doped with the impurity that it depletes at the operating voltage of the avalanche photodiode.

The avalanche photodiode according to the first embodiment also includes an n-field control layer 104 formed on the avalanche layer 103, a second light absorption layer 105 formed on the field control layer 104, an n-contact layer 106 formed on the second light absorption layer 105 and made of an n-type semiconductor, a p-contact 107 connected to the p-contact layer 101, and an n-contact 108 connected to the n-contact layer 106. In this avalanche photodiode, the p-contact layer 101, the first light absorption layer 102, the avalanche layer 103, the field control layer 104, the second light absorption layer 105, and the n-contact layer 106 are stacked in this order from the side of the p-contact 107.

Note that the first light absorption layer 102 and the second light absorption layer 105 are made of a III-V compound semiconductor with a band gap energy corresponding to a target wavelength of light, and the remaining layers are each made of a III-V compound semiconductor whose band gap energy is different from that of the first light absorption layer 102 and the second light absorption layer 105, as a matter of course. The band gap energy of the field control layer 104 is not less than the band gap energy of the light absorption layers and not more than the band gap energy of the avalanche layer 103.

In this avalanche photodiode, if a reverse bias voltage is applied between the p-contact 107 and the n-contact 108, the donor impurity in the field control layer 104 ionizes, and a high electric field is induced in the avalanche layer 103. The n-type doping amount in the field control layer 104 is set such that the impurity concentration in the second light absorption layer 105 sufficiently depletes at the time of reverse bias application.

In the layered structure of a conventional avalanche photodiode, an electron injection type in which a light absorption layer is provided on the p-contact side or a hole injection type in which a light absorption layer is provided on the n-contact side is employed, and the light absorption layer is provided on one side of an avalanche layer. This structure is based on a normal design guideline to keep a low avalanche excess noise factor.

As compared to the above-described structure, in the present invention, the first light absorption layer 102 doped into p-type and the second light absorption layer 105 are arranged on both sides of the avalanche layer 103. Under a condition that all the light absorption layers have the same thickness, the light absorption layer in the arrangement according to the present invention is merely divided into the first light absorption layer 102 and the second light absorption layer 105, and the light-receiving sensitivity in a state without avalanche multiplication does not change.

If electron-hole pairs are generated in the first light absorption layer 102 and the second light absorption layer 105 by light absorption, electrons in the first light absorption layer 102 reach the avalanche layer 103 by electron diffusion, and holes in the second light absorption layer 105 reach the avalanche layer 103 by hole drift. Both the electrons and the holes induce avalanche multiplication via an ionization process. As described above, according to the arrangement of the present invention, avalanche multiplication by dual injection is performed. The number of electron-hole pairs generated in the avalanche layer 103 by the electrons and the holes injected into the avalanche layer 103 depends on the thicknesses of the first light absorption layer 102 and the second light absorption layer 105 and the ionization rates of the electrons and the holes.

If the input light intensity is high, field strength displacement that occurs due to hole accumulation (space-charge effect) in a general undoped light absorption layer does not occur in the first light absorption layer 102. In the second light absorption layer 105, carrier accumulation near the avalanche layer 103 can occur concerning the electrons, which have a longer traveling distance up to the electrode, but the saturation velocity is higher by one order of magnitude than the holes. For this reason, the influence is small as compared to the space-charge effect by hole accumulation observed in a normal undoped light absorption layer.

Figure 2A:
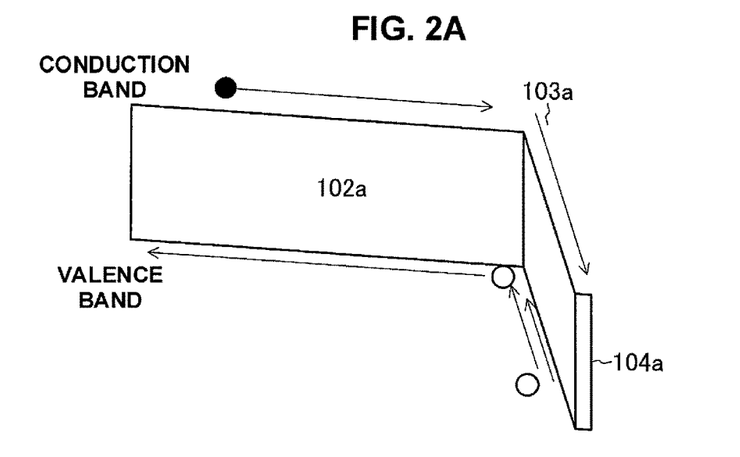
FIG. 2A is a band diagram schematically showing carrier transports in an electron injection type avalanche photodiode including a normal undoped light absorption layer.
Figure 2B:
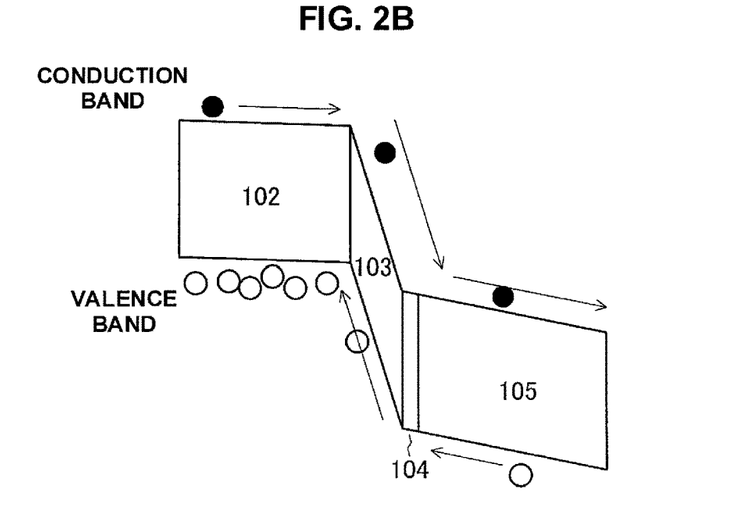
FIG. 2B is a band diagram schematically showing carrier transports in the avalanche photodiode according to the first embodiment of the present invention.

The band state of each of an electron injection type avalanche photodiode including a normal undoped light absorption layer and the avalanche photodiode according to the present invention will be described below. FIG. 2A is a band diagram schematically showing carrier transports in an electron injection type avalanche photodiode including a normal undoped light absorption layer. FIG. 2B is a band diagram schematically showing carrier transports in the avalanche photodiode according to the first embodiment of the present invention.

Note that in FIG. 2A, reference numeral 102a denotes an undoped light absorption layer; 103a, an avalanche layer; and 104a, a field control layer. Let Wabs0 be the thickness of the undoped light absorption layer 102a, Wabs1 be the thickness of the first light absorption layer 102, and Wabs2 be the thickness of the second light absorption layer 105. In addition, Wabs0=Wabs1+Wabs2. Hence, the conventional avalanche photodiode and the avalanche photodiode according to the present invention have the same light-receiving sensitivity in a state without multiplication. Referring to FIGS. 2A and 2B, a full circle represents an electron, and an open circle represents a hole.

In the avalanche photodiode including the conventional undoped light absorption layer, as shown in FIG. 2A, the electrons/holes generated in the undoped light absorption layer 102a travel by a distance corresponding to the thickness Wabs0. Additionally, if the multiplication factor (M) of the avalanche photodiode is as high as 10 or more, a number of holes generated by impact ionization in the avalanche layer 103a similarly travel by Wabs0. In general, the saturation velocity of holes is lower than that of electrons. Hence, if the input light intensity rises, hole accumulation occurs in the undoped light absorption layer 102a especially near the avalanche layer whose distance up to the electrode is long, and the field strength in the avalanche layer decreases.

In a case in which the multiplication factor is raised, the same influence as in the case in which the input light intensity is raised occurs. That is, the holes generated in the avalanche layer 103a are injected into the undoped light absorption layer 102a. However, the holes are accumulated near the avalanche layer 103a at a long distance up to the electrode. Hence, in the typical avalanche photodiode, more conspicuous degradation of the linearity of the output current with respect to the input light intensity is confirmed when the multiplication factor is high.

Figure 3:
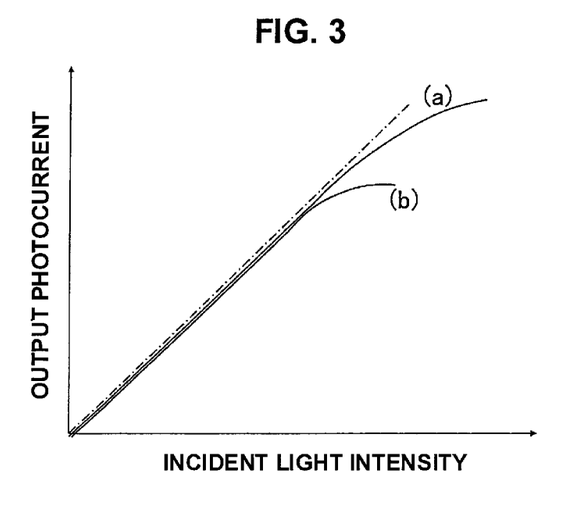
FIG. 3 is a graph showing a characteristic (a) of the avalanche photodiode according to the present invention and a characteristic (b) of the conventional avalanche photodiode including the undoped light absorption layer.

On the other hand, in the avalanche photodiode according to the present invention shown in FIG. 2B, the first light absorption layer 102 is of p-type. Hence, if the multiplication factor rises, the traveling distance of the holes is not so long as the thickness Wabs1, and the holes travel by dielectric relaxation mechanisms immediately after their injection into the first light absorption layer 102. Additionally, in the second light absorption layer 105, the holes generated by multiplication are not injected into this region, and only the electrons generated by multiplication are injected. Since the saturation velocity of electrons is higher than that of holes, the carrier transport characteristic does not largely degrade. FIG. 3 shows the relationship of the output current with respect to the above-described input light intensity. In FIG. 3, (a) represents the characteristic of the avalanche photodiode according to the present invention, and (b) represents the characteristic of the avalanche photodiode including the conventional undoped light absorption layer 102*a*.

Assume a UTC type light absorption layer doped into p-type. Holes generated by multiplication are injected into the light absorption layer and immediately cause dielectric relaxation without contribution to the carrier transport characteristic. The light absorption layer exhibits the same relationship between the input light intensity and the output current as in the avalanche photodiode according to the present invention shown in (a) of FIG. 3. However, if the light absorption layer thickness Wabs0 has a large value, the carrier transport mechanism in the p-type light absorption layer is electron diffusion, and therefore, the high-frequency characteristic considerably lowers.

Figure 4:
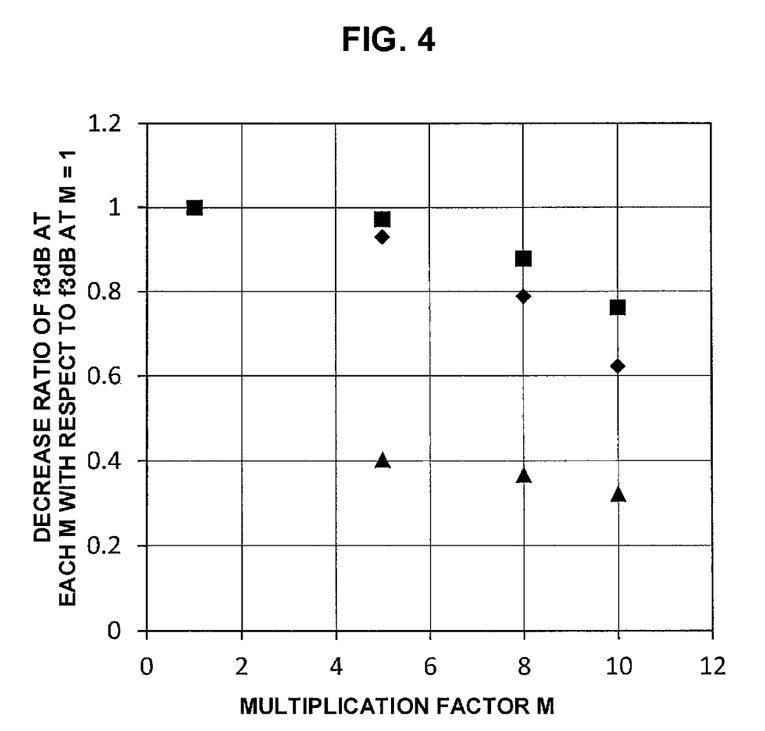
FIG. 4 is a graph showing the degradation ratio of the 3-dB bandwidth at each multiplication factor in an electron injection type avalanche photodiode (▲) including a normal undoped light absorption layer, an avalanche photodiode (■) including a UTC type light absorption layer, and an avalanche photodiode (♦) according to the present invention in a case in which the 3-dB bandwidth at M=1 is 1.

The relationship between the multiplication factor and the 3-dB bandwidth will be described next with reference to FIG. 4. FIG. 4 is a graph showing the degradation ratio of the 3-dB bandwidth at each multiplication factor in an electron injection type avalanche photodiode (▲) including a normal undoped light absorption layer, an avalanche photodiode (■) including a UTC type light absorption layer, and the avalanche photodiode (♦) according to the present invention in a case in which the 3-dB bandwidth at M=1 is 1.

Assume that Wabs0 and Wabs1+Wabs2 are set to 0.7 μm, and GBP (Gain Bandwidth Product) is set to 240 GHz. In addition, the thickness of each layer such as an avalanche layer except the light absorption layer is set to about 0.2 μm.

In the avalanche photodiode including the undoped light absorption layer, the 3-dB bandwidth degrades to about 40% at M=5, and degrades to about 30% at M=10. On the other hand, in the avalanche photodiode including the UTC type light absorption layer, the degradation ratio of the 3-dB bandwidth is about 20% even at M=10. This difference is considered to be generated by transport of holes generated by multiplication. The degradation of the 3-dB bandwidth by the multiplication factor in the p-type light absorption layer is simply considered to reflect only GBP. However, in the avalanche photodiode including the UTC type light absorption layer, carrier transport in the light absorption layer is done by electron diffusion. For this reason, the carrier transit time is relatively long for the thickness of about 0.7 μm and is not suitable for a high-speed operation.

In the avalanche photodiode according to the present invention, the degree of degradation of the 3-dB bandwidth determined by the carrier transit time with respect to the multiplication factor is greatly improved as compared to the avalanche photodiode including the undoped light absorption layer, as can be seen.

Even if the ionization rates of electrons and holes are different, the structure of the avalanche photodiode according to the present invention is effective if the ratio of the ionization rate of electrons to the ionization rate of holes falls within the range of about 2. As the ionization rate of one carrier becomes relatively high, and its contribution to avalanche multiplication caused by injection of the other carrier becomes small, the advantage of the avalanche photodiode according to the present invention tends to be lost. However, in general, the relative ratio of the ionization rate of electrons to that of holes tends to be low as the electric field rises, and the design concept of the present invention can widely be applied. An example of a material in which the ionization rates of electrons and holes are close is InP. An avalanche photodiode including an avalanche layer made of this semiconductor material is considered to be suitable for application of the present invention.

Second Embodiment

Figure 5:
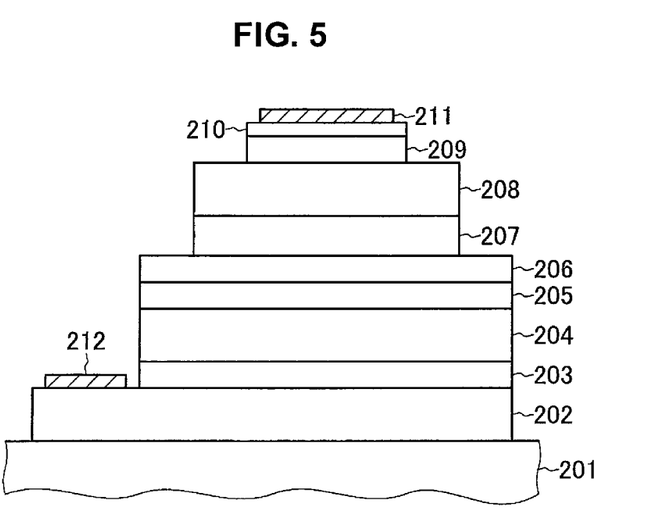
FIG. 5 is a sectional view showing the structure of an avalanche photodiode according to the second embodiment of the present invention.

The second embodiment of the present invention will be described next with reference to FIG. 5. FIG. 5 is a sectional view showing the structure of an avalanche photodiode according to the second embodiment of the present invention.

The avalanche photodiode includes a substrate 201, a p-contact layer 202 formed on the substrate 201 and made of a p-type semiconductor, a diffusion barrier layer 203 formed on the p-contact layer 202 and made of a p-type semiconductor, a first light absorption layer 204 formed on the diffusion barrier layer 203 and made of a p-type semiconductor, and an avalanche layer 205 formed on the first light absorption layer 204. The first light absorption layer 204 is formed into p-type by doping of a p-type impurity. Note that the first light absorption layer 204 is not so much doped with the impurity that it depletes at the operating voltage of the avalanche photodiode.

The avalanche photodiode according to the second embodiment also includes an n-field control layer 206 formed on the avalanche layer 205, a second light absorption layer 207 formed on the field control layer 206, an edge-field buffer layer 208 formed on the second light absorption layer 207, a first n-contact layer 209 formed on the edge-field buffer layer 208 and made of an n-type semiconductor, and a second n-contact layer 210 formed on the first n-contact layer 209 and made of an n-type semiconductor.

The avalanche photodiode also includes a p-contact 212 connected to the p-contact layer 202, and an n-contact 211 connected to the second n-contact layer 210. In this avalanche photodiode, the p-contact layer 202, the diffusion barrier layer 203, the first light absorption layer 204, the avalanche layer 205, the field control layer 206, the second light absorption layer 207, the edge-field buffer layer 208, the first re-contact layer 209, and the second n-contact layer 210 are stacked in this order from the side of the substrate 201.

Note that a plurality of avalanche photodiodes are formed on the substrate 201. However, FIG. 5 shows one avalanche photodiode formed on the substrate 201. The avalanche photodiodes are individually formed and electrically isolated by separating the p-contact layer 202 and the layers on the p-contact layer 202.

In the second embodiment, the diffusion barrier layer 203, the first light absorption layer 204, the avalanche layer 205, and the n-field control layer 206 have the same shape in a planar view and form a first mesa. In addition, the second light absorption layer 207 and the edge-field buffer layer 208 have the same shape in a planar view and form a second mesa having an area smaller than that of the first mesa. Furthermore, the first n-contact layer 209 and the second n-contact layer 210 have the same shape in a planar view and form a third mesa having an area smaller than that of the second mesa. The second mesa is formed inside the first mesa, and the third mesa is formed inside the second mesa. For example, the mesas only need to have a common central axis in the substrate normal direction.

Note that the first light absorption layer 204 and the second light absorption layer 207 are made of a III-V compound semiconductor with a band gap energy corresponding to a target wavelength of light, and the remaining layers are each made of a III-V compound semiconductor whose band gap energy is different from that of the first light absorption layer 204 and the second light absorption layer 207, as a matter of course. The band gap energy of the field control layer 206 is preferably equal to or more than the band gap of the avalanche layer 205. More ideally, the band gap energy of the field control layer 206 is equal to or more than the band gap of the avalanche layer 205, and simultaneously, the offset with respect to the valence band end of the avalanche layer 205 is preferably 100 meV or more from the viewpoint of preventing an impediment for hole transport.

For example, the substrate 201 is a semiconductor substrate made of semi-insulating InP that attains a high resistance by doping of iron. The p-contact layer 202 is made of InP in which a p-type impurity is heavily introduced. The diffusion barrier layer 203 is made of InGaAsP in which a p-type impurity is introduced. The first light absorption layer 204 is made of InGaAs in which a p-type impurity is introduced.

The p-contact layer 202 is made of InP. The field control layer 206 is made of InP in which an n-type impurity is introduced. The second light absorption layer 207 is made of InGaAs. The edge-field buffer layer 208 is made of undoped InP. The first re-contact layer 209 is made of InP in which an n-type impurity is introduced. The second n-contact layer 210 is made of InGaAsP in which an n-type impurity is heavily introduced.

A method of manufacturing the above-described avalanche photodiode will briefly be described next. First, p-type InP (p-contact layer 202), p-type InGaAsP (diffusion barrier layer 203), p-type InGaAs (first light absorption layer 204), InP (avalanche layer 205), n-type InP (field control layer 206), InGaAs (second light absorption layer 207), InP (edge-field buffer layer 208), n-type InP (first n-contact layer 209), and n-type InGaAsP (second n-contact layer 210) are sequentially deposited by epitaxial growth on the substrate 201 made of semi-insulating InP. These layers are formed by a well-known metalorganic vapor phase epitaxy (MOVPE) method.

Next, for example, the n-contact 211 is formed on the n-type InGaAsP layer. For example, a resist mask pattern including an opening in the region of the n-contact 211 is formed. A three-layered stacked film of titanium layer/platinum layer/gold layer is formed on the resist mask pattern by the electron-beam evaporation method. After that, when the resist mask pattern is removed, the n-contact 211 in ohmic contact with the n-type InGaAsP layer (second n-contact layer 210) can be formed. This is a manufacturing method called a lift-off method.

Next, the n-type InGaAsP layer, the n-type InP layer, the InP layer, the InGaAs layer, the n-type InP layer, the InP layer, the p-type InGaAs layer, and the p-type InGaAsP layer are pattered first by the known lithography and etching (wet etching) techniques to form the same shape as the above-described first mesa in a planar view. With this patterning, the p-contact layer 202, the diffusion barrier layer 203, the first light absorption layer 204, the avalanche layer 205, and the field control layer 206 are formed.

Next, the n-type InGaAsP layer, the n-type InP layer, the InP layer, and the InGaAs layer are pattered by the known lithography and etching (wet etching) techniques to form the same shape as the above-described second mesa in a planar view. With this patterning, the second light absorption layer 207 and the edge-field buffer layer 208 are formed. Next, the n-type InGaAsP layer and the n-type InP layer are pattered by the known lithography and etching (wet etching) techniques to form the above-described third mesa. With this patterning, the first n-contact layer 209 and the second n-contact layer 210 are formed. Part of the p-contact layer 202 is exposed to the periphery of the formed first mesa.

Finally, the p-contact 212 is formed on the p-contact layer 202 exposed by the patterning. The p-contact 212 has a three-layered structure of titanium layer/platinum layer/gold layer. The p-contact 212 is formed by the electron-beam evaporation method and the lift-off method, like the n-contact 211.

In the second embodiment, if a reverse bias voltage is applied between the p-contact 212 and the re-contact 211, the donor impurity in the n-field control layer 206 arranged on the avalanche layer 205 ionizes, and a high electric field is induced in the avalanche layer 205. The operation of the avalanche photodiode is the same as in the above-described first embodiment. Note that although not illustrated here, "band gap slope layers" each having a band gap between those of two layers may be provided between the first light absorption layer 204 and the avalanche layer 205 and between the n-field control layer 206 and the second light absorption layer 207. This arrangement is effective in a sense of suppressing the influence of the barrier on the hetero interface, as in a normal avalanche photodiode.

In the second embodiment, the first mesa, the second mesa, and the third mesa are arranged while sequentially reducing the area in a planar view. This aims at buffering the field strengths on the side surfaces of the first light absorption layer 204 and the second light absorption layer 207. In a structure in which the mesas in three steps are not formed, if the reverse bias voltage is raised to set the avalanche photodiode in an operating state, a potential distribution according to the potential inside the device (bulk) appears on the mesa surface, and a surface leakage current flows depending on the electric field. This is not preferable because it is a factor to degrade sensitivity in the receiving operation of the avalanche photodiode and also shorten the life of the avalanche photodiode.

In the avalanche photodiode according to the second embodiment as well, as the reverse bias voltage is raised to obtain the operating state, depletion occurs from part of the first light absorption layer 204 to part of the first n-contact layer 209 (second n-contact layer 210). However, if the depletion of the upper surface of the first mesa=the field control layer 206 ends, the potential of the field control layer 206 rarely changes even if the reverse bias voltage is further raised. This is because the dielectric constant of the medium (for example, an insulating material) on the field control layer 206 around the second mesa is much smaller than that of a semiconductor, and the spatial distance from the periphery of the first re-contact layer 209 (second n-contact layer 210) to the periphery of the first mesa is sufficiently long. As a result, it is possible to suppress an increase in the field strength on the periphery of the first mesa (cited literature 3).

The same as described above holds for the upper surface of the second mesa=first n-contact layer 209 (second n-contact layer 210). Even if the reverse bias voltage is further raised, the field strengths on the side surfaces of the second light absorption layer 207 and the edge-field buffer layer 208 never continuously rise.

In the second embodiment, the first light absorption layer 204 and the second light absorption layer 207 with the smallest band gap are arranged to sandwich the avalanche layer 205. For this reason, a caution is particularly required for buffering of the field strength on the side surface of a mesa, as compared to a conventional avalanche photodiode. As described above, the field strength on the side surface of a mesa can largely be reduced by forming a multistage mesa structure, as described above.

In the second embodiment, the diffusion barrier layer 203 made of, for example, InGaAsP is provided between the p-contact layer 202 and the first light absorption layer 204. The reason for this will be explained. Carrier transport in the first light absorption layer 204 is performed by electron diffusion. Hence, electrons generated in the first light absorption layer 204 by light absorption can diffuse to the side of the p-contact layer 202 as well. In this case, there is a fear that the light-receiving sensitivity becomes poorer than a value expected from the thickness of the first light absorption layer 204.

On the other hand, when the diffusion barrier layer 203 made of, for example, InGaAsP with a conduction band end which is higher than that of the light absorption layer material is provided, electron diffusion in the first light absorption layer 204 to the side of the p-contact layer 202 can be suppressed, and the electrons can travel to the side of the avalanche layer 205 more effectively.

As compared to a conventionally proposed inverted avalanche photodiode (see non-patent literature 3), the avalanche photodiode according to the present invention particularly needs a caution for the design from the viewpoint of ensuring reliability and operation stability. Generally, in the avalanche photodiode, the curvature of the p-n junction is smaller on the edge than at the center. Hence, the electric field on the edge becomes larger than the electric field at the center due to a very high reverse voltage applied to cause avalanche breakdown. Hence, a breakdown phenomenon occurs not at the center but on the edge.

In the inverted avalanche photodiode, the edge field to the avalanche layer is buffered by arranging an edge-field buffer layer adjacent to the avalanche layer. In the avalanche photodiode according to the present invention, edge breakdown may occur in the second light absorption layer 207 as well.

Additionally, when the multistage mesa structure according to the second embodiment is applied, an edge field is generated in the surface portion of the interface between the first n-contact layer 209 and the edge-field buffer layer 208 by concentration of electric lines of force derived from the structure. This edge field may cause edge breakdown by generating a high local electric field derived from the edge shape in the second light absorption layer 207 and the avalanche layer 205. If edge breakdown occurs, breakdown occurs at a voltage lower than a voltage for obtaining a sufficiently high multiplication factor of the avalanche photodiode. It is therefore difficult to perform an operation at a high multiplication factor.

On the other hand, the edge-field buffer layer 208 is provided to spatially separate the edge portion of the third mesa from the second light absorption layer 207 and the avalanche layer 205. Furthermore, the edge-field buffer layer 208 is formed by applying a material such as InP or InAlAs with a band gap larger than that of the second light absorption layer 207. These can suppress edge breakdown in the edge-field buffer layer 208 itself.

The field strength in the second light absorption layer 207 is preferably 200 kV/cm or less in the operating state of the avalanche photodiode. This aims at suppressing degradation of the material of InGaAs from the viewpoint of long-term reliability.

Here, InGaAs is used as the semiconductor material of the light absorption layers, and InP is used as the semiconductor material of the avalanche layer. However, the design concept of this patent does not necessarily limit the semiconductor materials to be used, and can be applied to combinations of various semiconductor materials.

Third Embodiment

Figure 6:
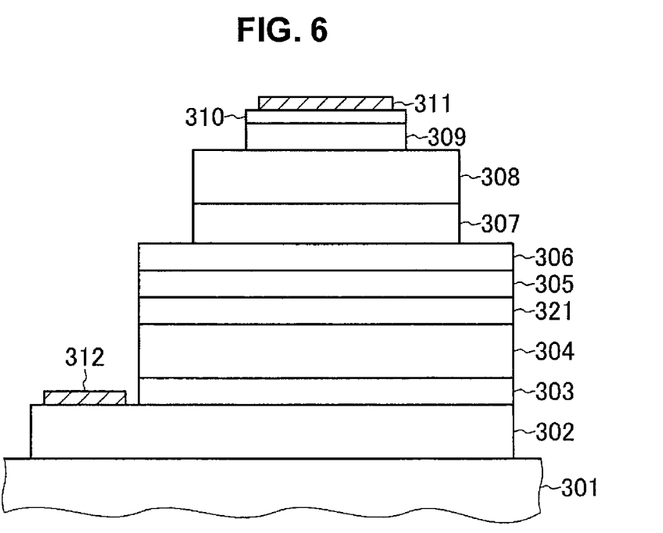
FIG. 6 is a sectional view showing the structure of an avalanche photodiode according to the third embodiment of the present invention.

The third embodiment of the present invention will be described next with reference to FIG. 6. FIG. 6 is a sectional view showing the structure of an avalanche photodiode according to the third embodiment of the present invention.

The avalanche photodiode includes a substrate 301, a p-contact layer 302 formed on the substrate 301 and made of a p-type semiconductor, a diffusion barrier layer 303 formed on the p-contact layer 302 and made of a p-type semiconductor, a first light absorption layer 304 formed on the diffusion barrier layer 303 and made of a p-type semiconductor, and an avalanche layer 305 formed on the first light absorption layer 304. The first light absorption layer 304 is formed into p-type by doping of a p-type impurity. Note that the first light absorption layer 304 is not so much doped with the impurity that it depletes at the operating voltage of the avalanche photodiode.

The avalanche photodiode according to the third embodiment also includes an n-field control layer 306 formed on the avalanche layer 305, a second light absorption layer 307 formed on the field control layer 306, an edge-field buffer layer 308 formed on the second light absorption layer 307, a first n-contact layer 309 formed on the edge-field buffer layer 308 and made of an n-type semiconductor, and a second n-contact layer 310 formed on the first n-contact layer 309 and made of an n-type semiconductor.

The avalanche photodiode also includes a p-contact 312 connected to the p-contact layer 302, and an n-contact 311 connected to the second n-contact layer 310. Additionally, in the third embodiment, a p-semiconductor layer 321 is provided between the first light absorption layer 304 and the avalanche layer 305. The p-semiconductor layer 321 has a band gap energy larger than that of the avalanche layer 305, and is made of, for example, InAlAs. The rest of the arrangement is the same as in the above-described second embodiment.

In the third embodiment, the diffusion barrier layer 303, the first light absorption layer 304, the p-semiconductor layer 321, the avalanche layer 305, and the n-field control layer 306 have the same shape in a planar view and form a first mesa. In addition, the second light absorption layer 307 and the edge-field buffer layer 308 have the same shape in a planar view and form a second mesa having an area smaller than that of the first mesa. Furthermore, the first n-contact layer 309 and the second n-contact layer 310 have the same shape in a planar view and form a third mesa having an area smaller than that of the second mesa.

Note that in the third embodiment, the p-semiconductor layer 321 is newly added to the avalanche photodiode according to the second embodiment. The manufacturing method is almost the same as in the second embodiment, and a detailed description thereof will be omitted.

Addition of the p-semiconductor layer 321 will be described below. Even for the conventional avalanche photodiode, it is generally known that a field control layer is used to set the field strengths in the avalanche layer and the light absorption layer to appropriate values in the operating state. In the third embodiment, the field control layer 306 is made of a material with a band gap equal to or larger than the band gap of the avalanche layer 305. This point will be explained first.

If the first light absorption layer 304 is heavily doped to p-type, it is difficult to consider that the entire first light absorption layer 304 completely depletes in the operating state of the avalanche photodiode. In the avalanche photodiode, however, a high voltage of 20 V or more is generally applied in the operating state, and the field strength in the avalanche layer 305 becomes as high as about 600 to 900 kV/cm. In such a high voltage state, a depletion layer of several ten nm is generated near the hetero interface to the avalanche layer 305 even if the first light absorption layer 304 is heavily doped to p-type.

If the electric field generated in the first light absorption layer 304 near the avalanche layer 305 reaches several hundred kV/cm, first, a tunnel leakage current is generated because the first light absorption layer 304 is typically made of InGaAs with a small band gap. Second, GBP lowers because the effective thickness of the avalanche layer 305 increases.

Figure 7:
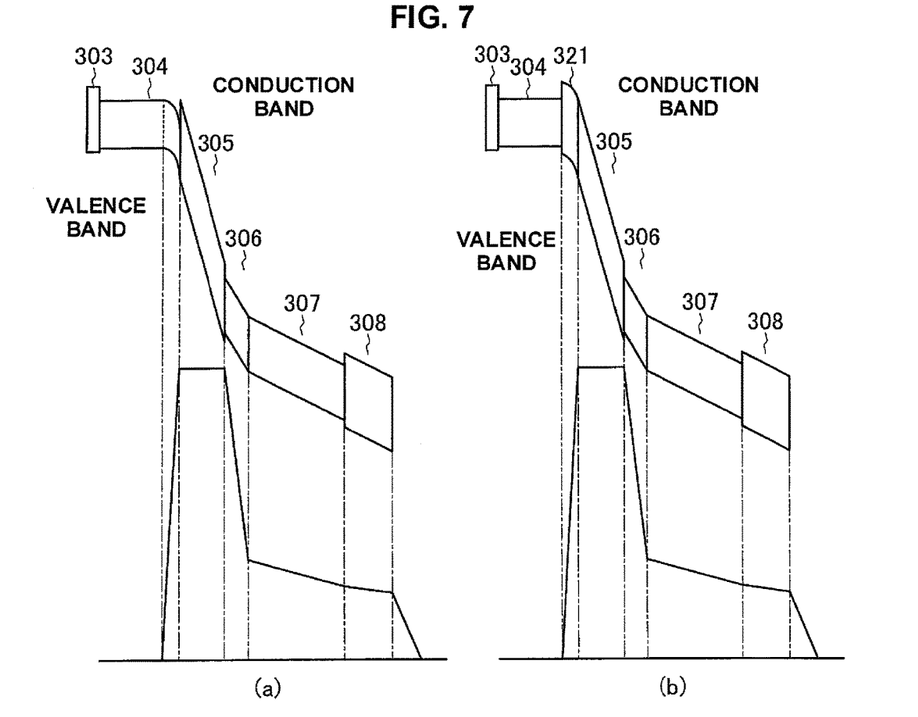
FIG. 7 shows band diagrams for explaining comparison of a tunnel leak between a case (a) in which a p-semiconductor layer 321 is absent and a case (b) in which a p-semiconductor layer 321 is present.

The band diagram of FIG. 7 shows states in which a tunnel leakage current is generated. In FIG. 7, (a) shows a case in which the p-semiconductor layer 321 is absent, and (b) shows a case in which the p-semiconductor layer 321 is present. As shown in (b) of FIG. 7, when the p-semiconductor layer 321 with a band gap energy equal to or more than that of the avalanche layer 305 is inserted, a tunnel leakage current generated between the first light absorption layer 304 and the avalanche layer 305 by an increase in the field strength can be suppressed, as compared to (a) of FIG. 7.

In addition, when a material with a band gap energy equal to or more than that of the avalanche layer 305 is used, conspicuous avalanche multiplication never occurs in the avalanche layer 305 even in a state in which the field strength in the p-semiconductor layer 321 is high.

As described above, when the p-semiconductor layer 321 is inserted, the reliability can be ensured. It is also possible to ensure a high design freedom for the film thickness of the avalanche layer of the avalanche photodiode and obtain high GBP.

Fourth Embodiment

Figure 8:
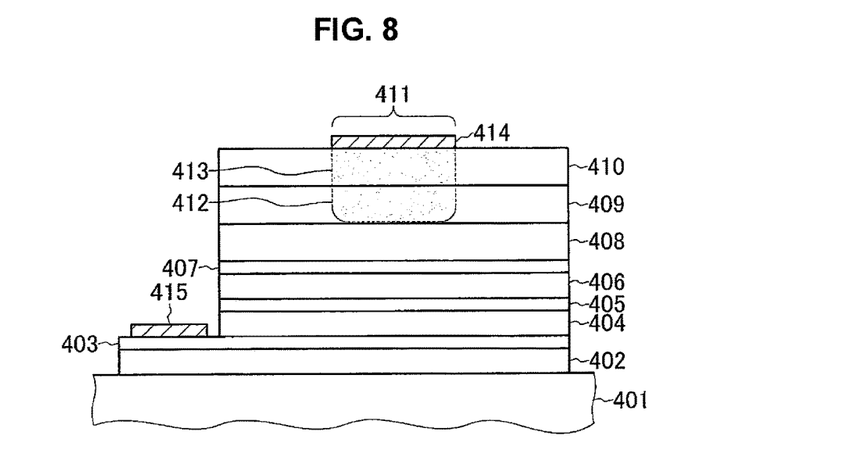
FIG. 8 is a sectional view showing the structure of an avalanche photodiode according to the fourth embodiment of the present invention.

The fourth embodiment of the present invention will be described next with reference to FIG. 8. FIG. 8 is a sectional view showing the structure of an avalanche photodiode according to the fourth embodiment of the present invention.

The avalanche photodiode includes a substrate 401, a second n-contact layer 402 formed on the substrate 401 and made of an n-type semiconductor, a first n-contact layer 403 formed on the second n-contact layer 402, a second light absorption layer 404 formed on the first n-contact layer 403, and an n-field control layer 405 formed on the second light absorption layer 404.

The avalanche photodiode also includes an avalanche layer 406 formed on the n-field control layer 405, a p-field control layer 407 formed on the avalanche layer 406, an edge-field buffer layer 408 formed on the p-field control layer 407, a first semiconductor layer 409 formed on the edge-field buffer layer 408, and a second semiconductor layer 410 formed on the first semiconductor layer 409.

A p-type impurity is introduced into an impurity introduction region 411 from the second semiconductor layer 410 to the first semiconductor layer 409. A first light absorption layer 412 is formed in the first semiconductor layer 409 in the impurity introduction region 411 in which the p-type impurity is introduced, and a p-contact layer 413 is formed in the second semiconductor layer 410 in the impurity introduction region 411 in which the p-type impurity is introduced. Note that in the fourth embodiment, the p-contact layer 413 also functions as a diffusion barrier layer. The avalanche photodiode also includes a p-contact 414 connected to the p-contact layer 413, and an n-contact 415 connected to the first n-contact layer 403.

For example, the substrate 401 is made of semi-insulating InP. The second n-contact layer 402 is made of n-type InP. The first n-contact layer 403 is made of n-type InGaAs. The second light absorption layer 404 is made of InGaAs. The n-field control layer 405 is made of n-type InAlAs.

The avalanche layer 406 is made of InP. The p-field control layer 407 is made of p-type InAlAs. The edge-field buffer layer 408 is made of InP. The first semiconductor layer 409 is made of InGaAs. The second semiconductor layer 410 is made of InAlAs.

The p-type impurity introduced into the impurity introduction region 411 is, for example, Zn. The impurity introduction region 411 is formed by selective diffusion in regions inside the first semiconductor layer 409 and the second semiconductor layer 410 in a planar view. In this case, the first light absorption layer 412 is made of p-type InGaAs containing Zn as a dopant, and the p-contact layer 413 is made of p-type InAlAs using Zn as a dopant.

In the fourth embodiment, the avalanche photodiode according to the present invention is applied to a "planar structure". In the fourth embodiment, buffering of the electric field on the element side surfaces is implemented not by the multistage mesa but by selective diffusion of Zn that is a p-type impurity. In the fourth embodiment, it is only necessary to expose part of the n-contact layer 403 by wet etching. Except this, a patterning process for element shape formation is not needed.

In the avalanche photodiode according to the fourth embodiment, when a voltage is applied between the p-contact 414 and the p-contact layer 413, depletion progresses first in the p-field control layer 407 and the n-field control layer 405. If the depletion in the p-field control layer 407 is completed, the field strength on the element side surfaces does not rise any more. Additional voltage application contributes only to an increase in the field strength in the layer immediately under the impurity introduction region 411 formed by selective doping of Zn. Hence, according to the fourth embodiment, it is possible to buffer the electric field on the side surfaces of the avalanche photodiode in the operating state without forming a multistage mesa.

In the fourth embodiment, since the exposure/development step for patterning that needs to be performed a plurality of times to form a multistage mesa in the above-described second and third embodiments can be reduced, and an element can be formed by electrode formation by one patterning and Zn selective diffusion, and metal vapor deposition and the like, the manufacturing step can be shortened. Note that in an arrangement in which the first light absorption layer is arranged on the substrate side, the n-contact layer that is the uppermost layer is formed by selective diffusion of an n-type impurity such as silicon.

Fifth Embodiment

Figure 9:
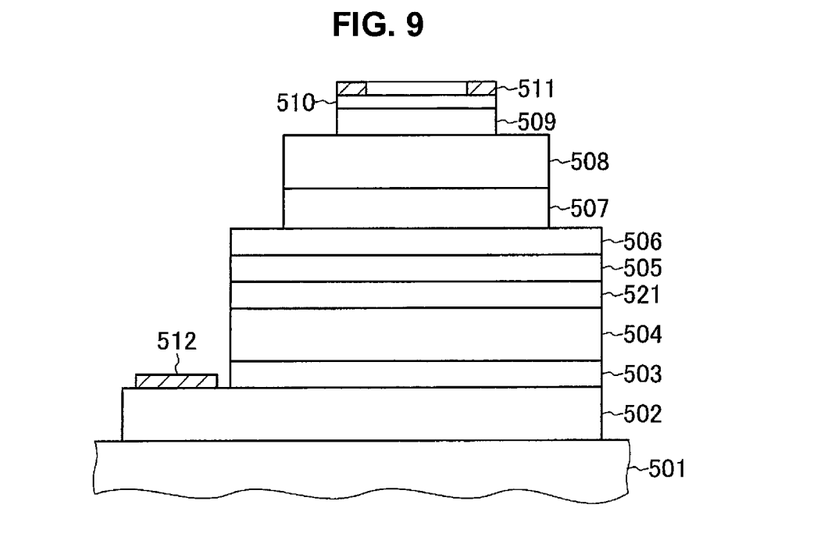
FIG. 9 is a sectional view showing the structure of an avalanche photodiode according to the fifth embodiment of the present invention.

The fifth embodiment of the present invention will be described next with reference to FIG. 9. FIG. 9 is a sectional view showing the structure of an avalanche photodiode according to the fifth embodiment of the present invention. The avalanche photodiode includes a substrate 501, a p-contact layer 502 formed on the substrate 501 and made of a p-type semiconductor, a diffusion barrier layer 503 formed on the p-contact layer 502 and made of a p-type semiconductor, a first light absorption layer 504 formed on the diffusion barrier layer 503 and made of a p-type semiconductor, and an avalanche layer 505 formed on the first light absorption layer 504. The first light absorption layer 504 is formed into p-type by doping of a p-type impurity. Note that the first light absorption layer 504 is not so much doped with the impurity that it depletes at the operating voltage of the avalanche photodiode.

The avalanche photodiode according to the fifth embodiment also includes an n-field control layer 506 formed on the avalanche layer 505, a second light absorption layer 507 formed on the field control layer 506, an edge-field buffer layer 508 formed on the second light absorption layer 507, a first n-contact layer 509 formed on the edge-field buffer layer 508 and made of an n-type semiconductor, and a second n-contact layer 510 formed on the first n-contact layer 509 and made of an n-type semiconductor.

The avalanche photodiode also includes a p-contact 512 connected to the p-contact layer 502, and an n-contact 511 connected to the second n-contact layer 510. The n-contact 511 has, for example, a ring shape on a planar view. In the avalanche photodiode according to the fifth embodiment, the doping concentration of the p-type impurity in the first light absorption layer 504 is set such that the impurity concentration lowers toward the second light absorption layer 507 from the side of the p-contact layer 502 to the side of the second light absorption layer 507. For example, the impurity concentration in the first light absorption layer 504 gradually lowers to the side of the second light absorption layer 507 (graded doping).

Additionally, in the fifth embodiment, a p-field control layer 521 is provided between the first light absorption layer 504 and the avalanche layer 505. The doping impurity concentration in the p-field control layer 521 is appropriately set such that it depletes at the operating voltage of the avalanche photodiode. The p-field control layer 521 has a band gap energy larger than that of the first light absorption layer 504, and is made of, for example, InAlGaAs. The rest of the arrangement is the same as in the above-described second embodiment.

In the fifth embodiment, the diffusion barrier layer 503, the first light absorption layer 504, the p-field control layer 521, the avalanche layer 505, and the n-field control layer 506 have the same shape in a planar view and form a first mesa. In addition, the second light absorption layer 507 and the edge-field buffer layer 508 have the same shape in a planar view and form a second mesa having an area smaller than that of the first mesa. Furthermore, the first n-contact layer 509 and the second n-contact layer 510 have the same shape in a planar view and form a third mesa having an area smaller than that of the second mesa.

Figure 10:
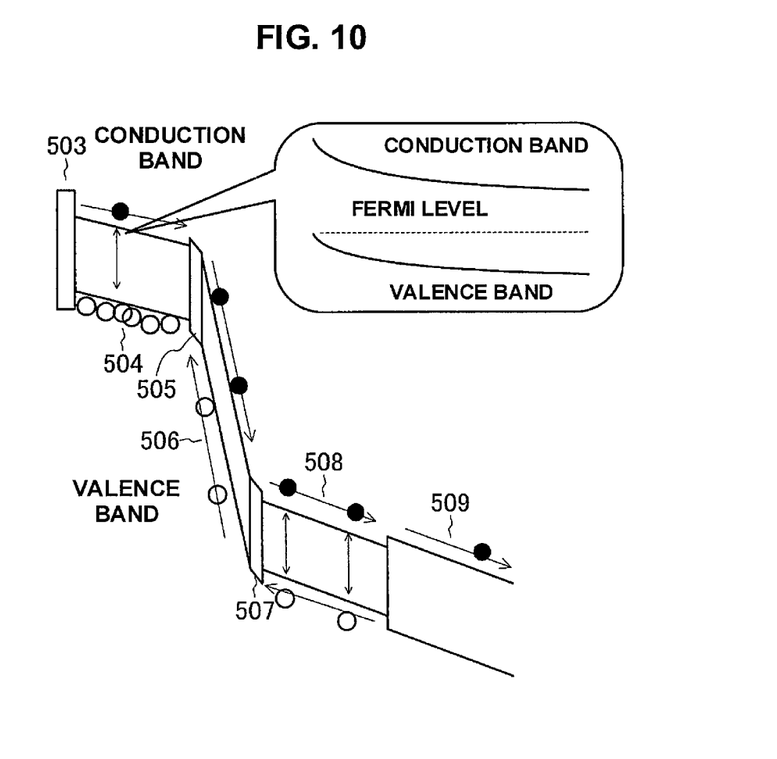
FIG. 10 is a band diagram schematically showing carrier transports in the avalanche photodiode according to the fifth embodiment of the present invention.

In the fifth embodiment as well, as shown in the band diagram of FIG. 10, if the multiplication factor rises, a number of holes generated by impact ionization in the avalanche layer 505 travel by dielectric relaxation mechanisms immediately after their injection into the first light absorption layer 504. Additionally, in the second light absorption layer 507, the holes generated by multiplication are not injected into this region, and only the electrons generated by multiplication are injected. Since the saturation velocity of electrons is higher than that of holes, the carrier transport characteristic does not largely degrade.

Note that in the fifth embodiment, the p-field control layer 521 is newly added to the avalanche photodiode according to the second embodiment, and the doping profile of the first light absorption layer 504 is changed. The manufacturing method is almost the same as in the second embodiment, and a detailed description thereof will be omitted.

The doping profile of the first light absorption layer 504 will be described below. As described above, in the present invention, the first light absorption layer 504 uses the operation principle of a UTC-PD, and uses electron diffusion as the carrier transport mechanism. In this case, the electron velocity in the first light absorption layer 504 is dominated by the electron mobility or diffusion coefficient.

In the first light absorption layer 504 according to the fifth embodiment, since the p-type impurity concentration on the side of the p-contact layer 502 is high, the conduction band end (V.B.) is located close to the Fermi level, as shown in the band diagram of FIG. 10. However, on the side of the second light absorption layer 507, the Fermi level is located relatively close to the side of the mid gap from the conduction band end because the impurity concentration is relatively low. As a result, in the operating state of the avalanche photodiode, the first light absorption layer 504 does not deplete but tilts the band as if a pseudo electric field were formed. For this reason, in the first light absorption layer 504 having the doping profile according to the fifth embodiment, the electrons have not only a diffusion component but also a drift component, and the electron velocity increases. As a result, according to the fifth embodiment, a wide band can be implemented.

The p-field control layer 521 will be described next. The p-field control layer 521 depletes in the operating state of the avalanche photodiode. If the p-field control layer 521 has a band gap equal to or more than that of the avalanche layer 505 and is simply formed into p-type by doping, an electron trap for the diffused electrons injected from the first light absorption layer 504 may be formed by band offset between the absorption layer and the p-type layer in the operating state of the avalanche photodiode.

However, if the p-field control layer 521 changes to a depleted state in the operating state, a predetermined electric field is applied to the p-field control layer 521 to tilt the band in the operating state of the avalanche photodiode. This can relax the barrier at the time of electron injection from the first light absorption layer 504 to the avalanche layer 505.

As described above, according to the fifth embodiment, it is possible to obtain a higher band.

The field control layer will be described here. In the avalanche photodiode, a very high electric field of several hundred kV/cm needs to be generated in the avalanche layer to cause impact ionization. If such a high field strength is generated in the light absorption layer as well, avalanche multiplication or Zener breakdown occurs in the light absorption layer.

The material and thickness of the avalanche layer of the avalanche photodiode are carefully selected to reduce excess noise in impact ionization and suppress band degradation even at a high multiplication factor. However, if avalanche multiplication occurs in the light absorption layer that is not so designed, the noise, multiplication, and band characteristic of the avalanche photodiode are limited by the multiplication characteristic of the light absorption layer without reflecting the multiplication characteristic of carriers in the avalanche layer.

If Zener breakdown occurs in the light absorption layer, a dark current increases at a voltage lower than in achieving a high multiplication factor in the avalanche layer of the avalanche photodiode, and breakdown occurs. In this case, the avalanche photodiode cannot obtain desired sensitivity.

To prevent the above-described avalanche multiplication or Zener breakdown in the light absorption layer, the avalanche photodiode is designed, by inserting the doped field control layer between the avalanche layer and the light absorption layer, to obtain a so-called "low-high" field strength profile in which the field strength in the light absorption layer lowers, and the field strength in the avalanche layer rises at the operating voltage of the avalanche photodiode. Generally, in an "electron injection type" avalanche photodiode in which the light absorption layer is arranged on the p-contact layer side, a p-type impurity is introduced to form a p-field control layer. In a "hole injection type" avalanche photodiode in which the light absorption layer is arranged on the n-contact layer side, an n-type impurity is introduced to form an n-field control layer.

As described above, according to the present invention, the p-type first light absorption layer and the second light absorption layer are provided to sandwich the avalanche layer. It is therefore possible to implement high linearity without sacrificing the light-receiving sensitivity and high speed. According to the present invention, it is possible to increase the sensitivity of a receiver in a communication method such as a digital coherent method that requires high linearity and a high speed.

Note that the present invention is not limited to the above-described embodiments, and many modifications and combinations can be made by those having general knowledge in the field without departing from the technical scope of the present invention.

EXPLANATION OF THE REFERENCE NUMERALS AND SIGNS

101 . . . p-contact layer, 102 . . . first light absorption layer, 103 . . . avalanche layer, 104 . . . field control layer, 105 . . . second light absorption layer, 106 . . . n-contact layer, 107 . . . p-contact, 108 . . . n-contact

The invention claimed is:

1. An avalanche photodiode comprising:
a p-contact layer made of a p-type semiconductor;
a first light absorption layer formed on the p-contact layer and made of a p-type semiconductor doped with a p-type impurity at a concentration that does not cause depletion at an operating voltage;
an avalanche layer formed on the first light absorption layer;
a field control layer formed on the avalanche layer;
a second light absorption layer formed on the field control layer,
wherein the avalanche layer and the field control layer are former between the first light absorption layer and the second light absorption layer;
an n-contact layer formed on the second light absorption layer and made of an n-type semiconductor;
a p-contact connected to the p-contact layer; and
an n-contact connected to the n-contact layer.

2. The avalanche photodiode according to claim 1, wherein the first light absorption layer and the avalanche layer are formed into an area larger than that of the n-contact layer.

3. The avalanche photodiode according to claim 1, further comprising a diffusion barrier layer arranged between the p-contact layer and the first light absorption layer and made of a p-type semiconductor, wherein a conduction band end of the diffusion barrier layer is higher than that of the first light absorption layer.

4. The avalanche photodiode according to claim 1, further comprising an edge-field buffer layer arranged between the second light absorption layer and the n-contact layer and made of a semiconductor with a band gap energy larger than that of the second light absorption layer.

5. The avalanche photodiode according to claim 1, further comprising a p-semiconductor layer arranged between the avalanche layer and the first light absorption layer and made of a p-type semiconductor with a band gap energy larger than that of the avalanche layer.

6. The avalanche photodiode according to claim 1, further comprising a p-field control layer formed into p-type between the avalanche layer and the first light absorption layer,
wherein the field control layer formed between the avalanche layer and the second light absorption layer is formed into n-type, and an impurity concentration in the first light absorption layer lowers toward the second light absorption layer from a side of the p-contact layer to a side of the second light absorption layer.

\* \* \* \* \*